United States Patent [19]

Huggins

[11] Patent Number: 4,546,262
[45] Date of Patent: Oct. 8, 1985

[54] ISOLATED HIGH VOLTAGE CONTROLLER

[75] Inventor: Raymond W. Huggins, Pittsford, N.Y.

[73] Assignee: Xerox Corporation, Stamford, Conn.

[21] Appl. No.: 508,389

[22] Filed: Jun. 27, 1983

[51] Int. Cl.[4] ............................................. G02B 27/00
[52] U.S. Cl. .................................... 250/551; 330/59; 307/311
[58] Field of Search ................. 250/209, 551; 330/10, 330/59; 332/9 R; 307/311, 359, 262

[56] References Cited

U.S. PATENT DOCUMENTS

| | | | |
|---|---|---|---|
| 3,590,251 | 6/1971 | Vosteen | 330/59 |
| 3,629,590 | 12/1971 | Case | 250/551 |
| 3,893,037 | 7/1975 | Herbert | 330/59 |
| 4,292,551 | 9/1981 | Kolmann | 307/311 |
| 4,339,670 | 7/1982 | Guajardo | 307/311 |

Primary Examiner—David C. Nelms
Assistant Examiner—J. Jon Brophy
Attorney, Agent, or Firm—Ronald F. Chapuran

[57] ABSTRACT

The use of pulse width modulation rather than analog excitation to control the resistance of a light emitting diode—photoresistor pair is described. In particular, for two LED/LDR opto-isolators in a totem pole configuration, the duty cycle of the first opto-isolator is arranged to equal 1 minus the duty cycle of the second opto-isolator. Thus, both opto-isolators are always active resulting in the ratiometric output being proportional to the duty cycle, and the output impedance being constant.

7 Claims, 3 Drawing Figures

ISOLATED HIGH VOLTAGE CONTROLLER

This invention relates to an isolated voltage controller, and in particular to the use of a high voltage isolator in a high voltage power supply in a negative feedback configuration.

It is known to use opto-isolators as isolation elements in high voltage controllers. U.S. Pat. No. 3,590,251 teaches the use of a light emitting diode (LED)/light dependent resistor (LDR) isolator as a high voltage control element wherein the LED is energized by an analog voltage. Two or four isolators in a totem pole or bridge system are used in a DC configuration to enable any output voltage between the positive and negative high voltage stages to be obtained. A difficulty, however, with such a DC configuration is that only one element in the totem pole or two elements in the bridge arrangements are active at any time and the system operation depends upon the presence of a load resistance.

It would be desirable, therefore to provide a high voltage controller that exhibits minimal dependence on the load resistance and provides a reliable feedback control. Accordingly, it is an object of the present invention to provide a new and improved isolated high voltage controller. It is another object of the invention to provide a negative feedback configuration and a high voltage power supply wherein the output impedance is constant and the response characteristic of the system is independent of the sign of the transition. It is another object of the present invention to overcome problems associated with a DC control while retaining the simplicity of using optoisolators.

Further objects and advantages of the present invention will become apparent as the following description proceeds and the features of novelty characterizing the invention will be pointed out with particularity in the claims annexed to and forming a part of this specification.

Briefly, the present invention is the use of pulse width modulation rather than analog excitation to control the resistance of a photorestor. In particular, the duty cycle of a first opto-isolator (an LED/LDR configuration) is arranged to equal 1 minus the duty cycle of a second opto-isolator (an LED/LDR configuration). Thus, both opto-isolators are always active providing an output which is proportional to the duty cycle.

For better understanding of the present invention, reference may be had to the accompanying drawings, wherein the same reference numerals have been applied to like parts and wherein.

Figure 1:
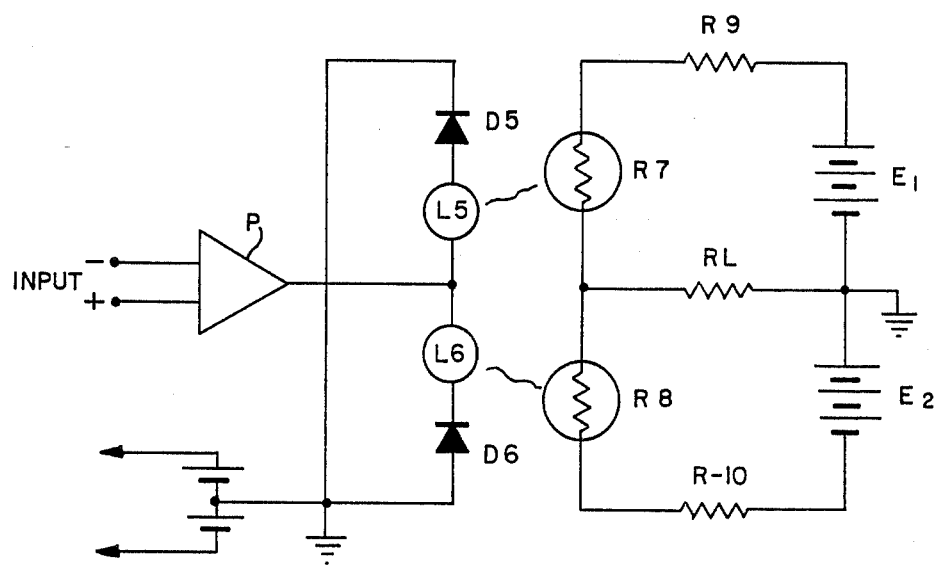
FIG. 1 is a schematic illustration of the prior art.

With reference to FIG. 1, there is shown a prior art configuration. In particular, an operational preamplifier P has its output connected to the parallel connection of light sources L5 and L6. Diodes D5 and D6 are connected in series with the light sources L5 and L6 respectively to polarize the current flow depending upon the polarity of the output signals of the operational preamplifier. Photoconductor elements having values of resistance that vary inversely with the amount of light to which they are exposed are operatively associated with the individual light sources. In particular, photoconductor element R7 is associated with light sources L5 and photoconductor element R8 is associated with light source L6.

Light source L5 will be energized in response to positive output signals from the operational preamplifier and light source L6 will be energized in response to negative output signals. Photoconductor elements R7 and R8 are respectively optically coupled to light sources L5 and L6. The high voltage supply is divided between the circuits comprising photoconductor elements R7 and R8. Voltage supply E1 is operative when a positive output voltage is produced by the operational preamplifier to energize light source L5 to thereby decrease the resistance of photoconductor element R7. This causes a positive output to be produced at the output of the operational amplifier across load resistor RL.

Similarly, when a negative output voltage is produced by the operational preamplifier, voltage supply E2 is operative to produce a negative output voltage from the operational amplifier across load resistor RL. This is because when a negative output voltage is produced by the operational preamplifier, light source L6 is energized and since it is optically coupled to photoconductor element R8, the resistance of the latter decreases and a negative voltage is thereby produced across load resistor RL. Resistors R9 and R10 are current-limiting resistances. Further, voltage supplies E1 and E2 are typically equal in potential value.

One advantage claimed for this configuration in which only one light source is energized at any one time is a high efficiency in the photoconductor output circuit. In many instances, however, this advantage is more than offset by the presence of a dead zone, which leads to crossover distortion. Also, transient response can be adversely affected by the presence of a dead zone. Finally, the output impedance of the photoconductor output circuit will vary with the current being delivered to the load. In an attempt to overcome some of these disadvantages, the addition of bias voltages in series wiht the diodes has been suggested.

The above problems can be overcome by driving both lamps simultaneously so that both photoconducting cells are conducting. Although this mode of operation leads to a decrease in efficiency at low output power levels, the decrease becomes less significant at high output power levels since one of the photoconducting cells could be near cut-off. Hence, the dissipation in the photoconducting cells at high output power levels will be only marginally increased. This mode of operation is analagous to amplifier class A operation which is noted for low distortion.

Two equally valid methods of driving both lamps simultaneously are available. One method is to eliminate the diodes in FIG. 1A if incandescent light sources are used, or replace them with resistors if LEDs are used. An alternative method is to drive the lamps with pulses and to vary the level of the drive by pulse width modulation. The latter method enables the lamps to be driven more efficiently, and is easier to implement with a single sided supply.

Figure 2:
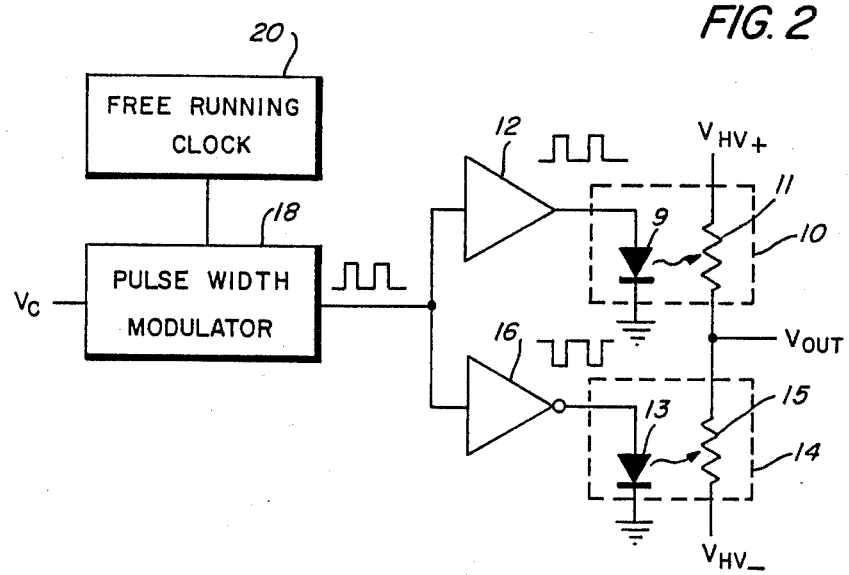
FIG. 2 is a schematic block diagram of a pulse width modulation high voltage controller in accordance with the present invention.

With reference to FIG. 2, there is shown a pulse width modulation high voltage isolator in accordance with the present invention. In particular, there is shown a first light emitting diode/light dependent resistor pair or isolator 10 connected to a buffer 12 and a second light emitting diode/light dependent resistor pair or isolator 14 connected to an inverting buffer 16, the buffers 12, 16 being connected to a pulse width modulator 18. The isolator 10 comprises light emitting diode (LED) 9 and light dependent resistor (LDR) 11. The isolator 14 comprises light emitting diode (LED) 13 and light dependent resistor (LDR) 15.

The pulse width modulator 18 is driven by a free running clock and the input $V_c$ from a not shown differential amplifier. The pulse train output from the pulse width modulator 18 is conveyed to the first LED/LDR isolator 10 through the buffer 12 and is inverted and conveyed to the second LED/LDR isolator 14 through the inverting buffer 16.

Provided that the period of the pulse repetition rate is short compared to the time constant of the photoelectric cells, the resistance of the cells will vary inversely as the duty cycle. FIG. 2 shows the output from the pulse width modulator being applied to one LED, and its inverse to the other. Assuming that the LED/LDR devices are exactly matched, the high voltage output will vary linearly with the duty cycle. The $V_{HV+}$ to $V_{HV-}$ duty cycle is in turn controlled by the control voltage, and operational stability can be improved by the application of conventional negative feedback techniques. Pulse width modulation of each of the LED/LDR isolators is used rather than analog excitation. In the totem pole configuration shown in FIG. 2, the duty cycle of the first LED 9 is arranged to equal 1 minus the duty cycle of the second LED 13. Thus, both opto-isolators are always active.

If the LED in an LED/LDR opto-isolator is excited by a pulse train of duty cycle D and frequency f, provided that the time constant of the LDR is long compared to 1/f, the conductance of the LDR will equal $$G = DG_o$$

where $G_o$ equals the conductance of the LDR when $D = 1.0$ and is determined by the value of the on current through the LED. In the configuration as shown in FIG. 2, where $D_1 + D_2 = 1 (0 < D < 1)$, and where $G_o$ is the same for each LDR, it can be shown that the unloaded output voltage is $$V_{out} = D \cdot V_{HV+} + (1 - D) \cdot V_{HV-}$$

and that the output impedance is constant and equals $1/G_o$. Note that the magnitude of $V_{HV+}$ is not necessarily equal to $V_{HV-}$. D can easily be controlled by a pulse width modulator with a DC voltage $V_c$ as an input. The overall transfer function of the high voltage isolator is given by $$V_{out} = \frac{V_c}{V_{co}} \cdot V_{HV+} + \left(1 - \frac{V_c}{V_{co}}\right) \cdot V_{HV-}$$

where $$D = \frac{V_c}{V_{co}}$$

Advantages of this arrangement are that the unloaded high voltage output is directly proportional to the low voltage input control signal $V_c$, that the output impedance is constant, and that the step response characteristic is independent of the sign of the transition. Additional advantages are no dead zone, no crossover distortion, and much better linearity between $V_{out}$ and the input or control voltage.

Figure 3:
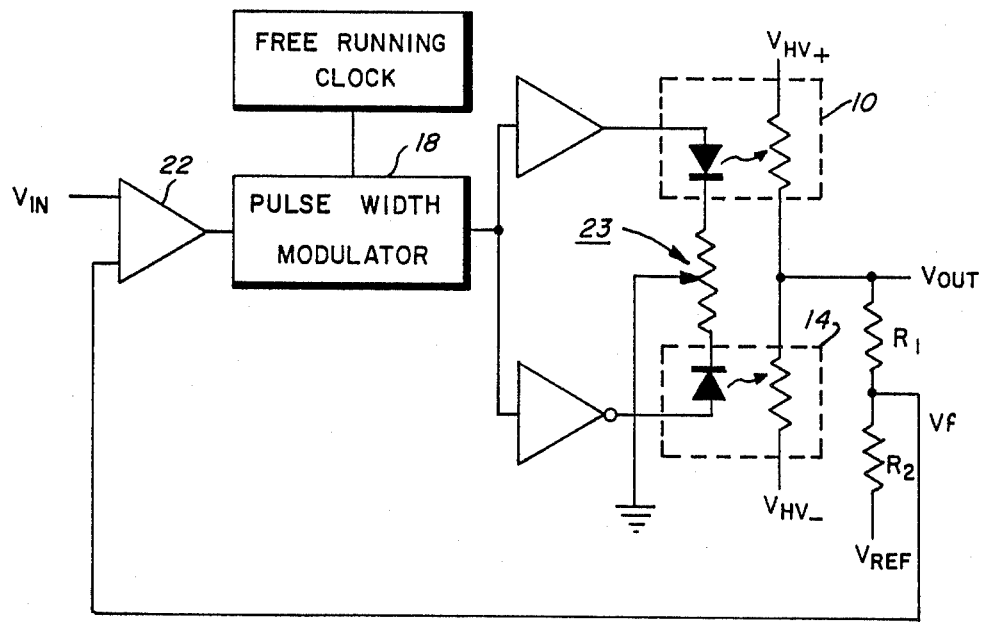
FIG. 3 is a schematic block diagram of a high voltage power supply in a negative feedback configuration in accordance with the present invention.

With reference to FIG. 3, the high voltage isolator shown in FIG. 2 has been incorporated into a high voltage power supply in a negative feedback configuration. The pulse output from the modulator is buffered and inverted and both the inverted and non-inverted pulses used to drive the LEDs in the LED/LDR opto-isolators 10, 14. The mean level of the LED "on" driving currents is determined by the resistance of the balance potentiometer 23.

The free running oscillator frequency is such that the period is much shorter than the LDR time constant so that the apparent resistance of the LDRs is determined by the duty cycle of the pulse. If more current is drawn at the output, the control is arranged such that the pulse width modulation duty cycle to LED 1 increases, and to LED 2, decreases, as demanded by the feedback error signal. Advantages are that no pull-down resistor is required. Both LDRs are continuously active for all output voltages except when $V_{out} = V_{HV+}$ or $V_{HV-}$.

In particular, it can be shown that the open circuit output voltage $V_{out}$ can be determined as follows:

$$V_F = V_{ref} + (V_{out} - V_{ref}) \frac{R_2}{R_1 + R_2} \quad (1)$$

$$= V_{ref} + (V_{out} - V_{ref})F$$

where $F = \frac{R_2}{R_1 + R_2}$

Also, $$V_{out} = (V_{in} - V_F)A \quad (2)$$

where A is the gain of the differential amplifier - pulse width modulator - LED/LDR combination. Substituting Equation 1 into Equation 2 gives $$\frac{V_{out}}{A} = V_{in} - V_{ref} - V_{out}F + V_{ref}F$$

or solving for $V_{out}$, $$V_{out} = V_{in} \cdot \frac{A}{1 + AF} - V_{ref} \cdot \frac{A(1-F)}{1 + AF}$$

$$\text{For } A >> 1 \quad V_{out} \approx \frac{V_{in}}{F} - V_{ref} \frac{1-F}{F}$$

Note that although A is a function of the values of $V_{HV\pm}$, when A is large, the sensitivity of $V_{out}$ to $V_{HV\pm}$ is reduced as predicted by conventional feedback theory. Also, the output impedance can be shown to be $\approx G_o/A$ again as predicted by conventional feedback theory.

While there has been illustrated and described what is at present considered to be a preferred embodiment of the present invention, it will be appreciated that numerous changes and modifications are likely to occur to those skilled in the art, and it is intended in the appended claims to cover all those changes and modifications which fall within the true spirit and scope of the present invention.

What is claimed is:

1. A high voltage controller comprising a first and a second light source, a buffer connected to the first light source, an inverting buffer connected to the second light source, a pulse width modulator, the output of the pulse width modulator connected to the buffer and inverting buffer, a first light dependent resistor optically coupled to the first light source, a second light dependent resistor optically coupled to the second light source, the light dependent resistors having a common connection, a load circuit connected to the common connection of the light dependent resistors, a differential amplifier providing an input circuit to the pulse width modulator, and a feedback circuit interconnecting the common connection of the light dependent resistors, each of the light dependent resistors connected to a high voltage source, and the differential amplifier whereby a constant output impedance high voltage controller is provided.

2. The high voltage controller of claim 1 wherein each of the light sources is a light emitting diode having a duty cycle of the first light emitting diode is arranged to equal 1 minus the duty of the second light emitting diode.

3. A high voltage controller comprising a first opto-isolator, the input to the first opto-isolator being connected to a buffer, a second opto-isolator, the input to the second opto-isolator being connected to an inverting buffer, the outputs of the first opto-isolator and the second opto-isolator being connected in common, a load circuit, the common connection of the opto-isolators providing an output voltage to the load circuit, and a pulse width modulator providing an output signal to the buffer and the inverting buffer, the pulse width modulator being connected to the outputs of the opto-isolators to provide a relative constant output impedance at the load circuit.

4. The high voltage controller of claim 3 wherein each of the opto-isolators is a light emitting diode and light dependent resistor pair.

5. The high voltage controller of claim 4 including a differential amplifier providing an input to the pulse width modulator, and a feedback circuit interconnecting the common connection of the opto-isolators and the differential amplifier.

6. The high voltage controller of claim 4 wherein the duty cycle of the first light emitting diode-light dependent resistor pair is arranged to equal 1 minus the duty cycle of the second light emitting diode-light dependent resistor pair.

7. A high voltage controller comprising a first opto-isolator pair having a light emitting diode and a light dependent resistor, a second opto-isolator having a light emitting diode and a light dependent resistor, each of the light dependent resistors connected to a high voltage supply, and the common connection of the light dependent resistors providing an output voltage to a load, an input buffer connected to the first opto-isolator, an inverting buffer connected to the second opto-isolator, a pulse width modulator, the output of the pulse width modulator connected to the buffer and inverting buffer, a differential amplifier providing an output signal to the pulse width modulator, and a feedback circuit having a voltage divider network connected to the output voltage and a reference voltage, the voltage divider tap being connected to one input of the differential amplifier.

* * * * *